United States Patent [19]

Takada et al.

[11] Patent Number: 4,837,852
[45] Date of Patent: Jun. 6, 1989

[54] ELECTRONIC TUNING CIRCUIT FOR AM RECEIVER WHICH IS EASY TO EFFECT TRACKING ADJUSTMENT

[75] Inventors: Noboru Takada; Hajime Yokoyama, both of Saitama, Japan

[73] Assignees: Toko, Inc., Tokyo; Matsushita Electric Industrial Co., Ltd., Osaka, both of Japan

[21] Appl. No.: 874,067

[22] Filed: Jun. 13, 1986

[30] Foreign Application Priority Data

Jun. 17, 1985 [JP] Japan .................. 60-131540
Jun. 28, 1985 [JP] Japan .................. 60-143508
Jan. 9, 1986 [JP] Japan .................. 61-2733

[51] Int. Cl.⁴ .............................. H04B 1/26
[52] U.S. Cl. .................. 455/197; 455/193; 455/196
[58] Field of Search .......... 455/197, 193, 195, 198, 455/196, 180, 188, 191, 340, 182, 192, 257-262; 343/745

[56] References Cited

U.S. PATENT DOCUMENTS

| | | |
|---|---|---|
| 3,350,648 | 10/1967 | Beres et al. .................. 455/197 |
| 3,571,715 | 3/1971 | Beary et al. .................. 455/193 |
| 3,579,115 | 5/1971 | Roselle et al. .................. 455/196 |
| 3,611,154 | 10/1971 | Kupfer .................. 455/195 |
| 3,617,899 | 11/1971 | Roselle et al. .................. 455/195 |
| 3,878,467 | 4/1975 | Manson .................. 455/196 |
| 4,384,365 | 5/1983 | Malinowski .................. 455/197 |
| 4,442,548 | 4/1984 | Lehmann .................. 455/197 |
| 4,628,540 | 12/1984 | Hendricks .................. 455/197 |
| 4,658,437 | 4/1987 | Ersoz et al. .................. 455/197 |
| 4,736,456 | 4/1988 | Maier .................. 455/197 |
| 4,739,517 | 4/1988 | Okanobu .................. 455/197 |

*Primary Examiner*—Robert L. Griffin
*Assistant Examiner*—Curtis Kuntz

[57] ABSTRACT

An electronic tuning circuit for AM receiver is disclosed which is so designed that tracking errors are minimized by increasing the accuracy of constants for tuning coils, oscillation coils and capacitance elements incorporated in an antenna tuning circuit, a high-frequency amplifier circuit and a local oscillator circuit which constitute the electronic tuning circuit. After the electronic tuning circuit has been mounted in place, tracking adjustment is effected at one point of the receiving frequency band, or alternatively no such adjustment is required.

5 Claims, 5 Drawing Sheets

4,837,852

ELECTRONIC TUNING CIRCUIT FOR AM RECEIVER WHICH IS EASY TO EFFECT TRACKING ADJUSTMENT

BACKGROUND OF THE INVENTION

1. Field of the Invention

This invention relates to an electronic tuning circuit for AM receiver adapted to receive desired broadcast waves with the aid of the electronic tuning circuit using variable capacitance diodes.

2. Description of the Prior Art

In order to have a better understanding of the present invention, description will first be made of a conventional electronic tuning circuit for AM receiver with reference to FIG. 9 of the accompanying drawings. As shown in FIG. 9, the conventional electronic tuning circuit comprises an antenna tuning circuit 12, a high-frequency amplifier circuit 13, a local oscillator circuit 15; and the AM receiver includes, in addition to such an electronic tuning circuit, a mixer circuit 15 provided at the back thereof, an intermediate-frequency amplifier circuit, a detector circuit, a low-frequency amplifier circuit and so forth. Indicated at 16 is a tuning voltage source 16 which is arranged to apply a tuning voltage $V_a$ to the antenna tuning circuit 12 and high-frequency amplifier circuit 13 and to apply an oscillation frequency controlling voltage $V_b$ to the local oscillator circuit 14. $L_{11}$ to $L_{13}$ are tuning coils; $C_{11}$ to $C_{13}$ are trimmer capacitors; $D_{11}$ to $D_{13}$ are variable-capacitance diodes; $C_{21}$ to $C_{23}$ are capacitors; and $C_{31}$ is a padding capacitor. With the conventional AM receiver, tracking adjustment is effected at three points in the receiving frequency band by adjusting the tuning coils $L_{11}$ to 13 and trimmer capacitors $C_{11}$ to $C_{13}$.

A more detailed explanation of the conventional tracking adjustment is this: The local oscillator circuit is first adjusted; subsequently, the antenna tuning circuit and high-frequency amplifier circuit are adjusted; and finally tracking error at the center point of the receiving frequency band is confirmed. Generally, adjustment in the lower frequency range is effected by means of the tuning coils, while adjustment in the higher frequency range is effected by means of the trimmer capacitors. Thus, the conventional electronic tuning circuit for AM receiver is disadvantageous in that a number of components for effecting tracking adjustment are mounted so that a correspondingly increased number of steps are involved in the tracking adjustment, which leads to an increase in the manufacturing cost.

Another disadvantage of the conventional electronic tuning circuit is such that in case tracking adjustment cannot be effected, it is required either that all the mounted components be discarded or that adjustment be effected after the components have been replaced with new ones, due to the fact that tracking adjustment is effected after the tuning circuit at the front end portion of the AM receiver and succeeding IF amplifier and so forth have been mounted on a printed circuit board.

SUMMARY OF THE INVENTION

Accordingly, it is an object of the present invention to provide an electronic tuning circuit for AM receiver, which is so designed that tracking adjustment can conveniently be effected, thereby obviating the aforementioned disadvantages of the prior art.

Another object of the present invention is to provide an electronic tuning circuit for AM receiver, which is so designed that a satisfactory receiving condition can be maintained without effecting tracking adjustment after the electronic tuning circuit has been mounted in place.

Still another object of the present invention is to provide a miniaturized electronic tuning circuit for AM receiver, which may be formed of only a small number of components.

Briefly stated, according to the present invention, there is provided an electronic tuning circuit for AM receiver wherein an oscillation frequency controlling voltage for setting the oscillation frequency of a local oscillator circuit to be higher or lower than the tuned frequency, and a tuning voltage to an antenna tuning circuit and a tuning circuit of a high-frequency amplifier circuit, are supplied through a preset system such as PLL synthesizer system or search-tuning system, the electronic tuning circuit being designed such that the tolerances for the inductance of the tuning coil of the local oscillator circuit, for the inductance of the tuning coil of the high-frequency amplifier circuit, for the inductance of the tuning coil of the antenna tuning circuit, and for parallel capacitances connected in parallel with the tuning coils and including stray capacitances, are set up to be within the range of ±5%, thereby eliminating the necessity to incorporate any trimmer capacitor, and a maximum receiving sensitivity can be set substantially at the center of the receiving frequency band simply by adjusting the tuning coil of the antenna tuning circuit or the tuning coil of the high-frequency amplifier circuit.

Furthermore, according to the present invention, there is also provided an electronic tuning circuit which is designed such that the dispersion tolerance for the capacitance of a padding capacitor is set up to be within the range of ±2%, so that the electronic tuning circuit does not have to be subjected to tracking adjustment after having been mounted in the AM receiver.

Other objects, features and advantages of the present invention will become apparent from the ensuing description taken in conjunction with the accompanying drawings.

DESCRIPTION OF THE PREFERRED EMBODIMENTS

Figure 1:
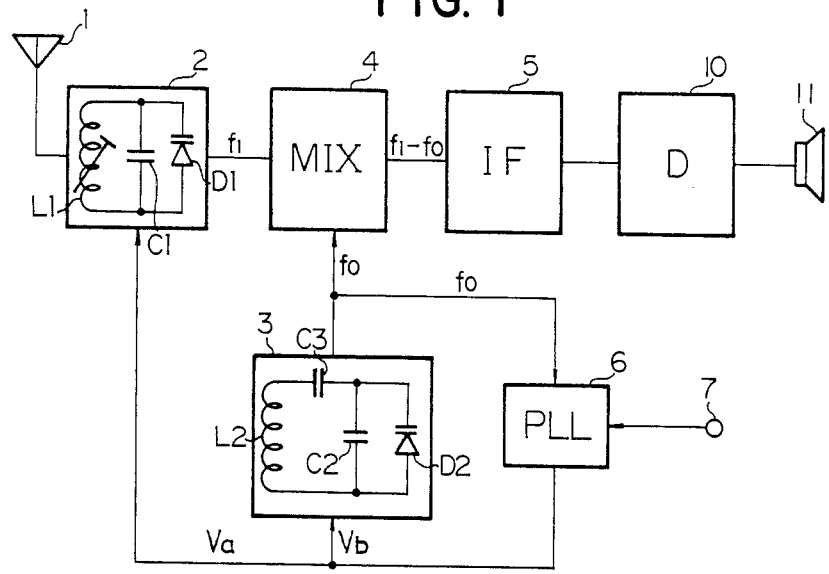
FIG. 1 is a block diagram showing an AM receiver provided with the electronic tuning circuit according to an embodiment of the present invention.

Referring to FIG. 1, there is shown the electronic tuning circuit for AM receiver according to an embodiment of the present invention, which comprises an antenna 1, an antenna tuning circuit 2, a local oscillator circuit 3, a mixer circuit 4, an intermediate-frequency amplifier circuit 5, and a PLL circuit 6. Indicated at 7 is a terminal to which is applied a program signal for achieving tuning to a desired broadcast wave.

With such an AM receiver, a signal of a desired frequency $f_1$ is selected in the antenna tuning circuit 2 and passed to the mixer circuit 4 so as to be added to the oscillation frequency $f_0$ derived from the local oscillator circuit 3, and converted to an intermediate frequency $(f_1+f_0)$. With another receiver, an intermediate frequency $(f_1+f_0)$ is established. The oscillation frequency $f_0$ and tuned frequency $f_1$ are established on the basis of a predetermined program signal which is applied, via the terminal 7, to the PLL circuit 6. A tuning voltage Va and an oscillation frequency controlling voltage Vb are applied through the PLL circuit 6 to a variable capacitance diode D1 of the antenna tuning circuit 2 and variable capacitance diode D2 of local oscillator circuit 3 so that a resonance circuit resonant to the desired frequency and an oscillator circuit are established and thus tuning to the desired frequency is achieved. As will be appreciated, such a receiver constitutes an AM receiver of the so-called preset-tuner type using a PLL synthesizer. Needless to say, the receiver may be an AM receiver of the search-tuning type.

The front-end portion of the receiver includes tuning coils L1 and L2, parallel capacitances C1 and C2, a padding capacitor C3, and the variable capacitance diodes D1 and D2. Stray capacitances tend to differ from one type of receiver to another; with the advanced manufacturing technology of today, however, it is possible to produce electronic tuning circuits which are substantially free from dispersions in stray capacitances, in so far as the electronic tuning circuits are of the same type. It goes without saying that variable capacitance diodes with minimum dispersions in characteristics are selected as D1 and D2.

Figure 2:
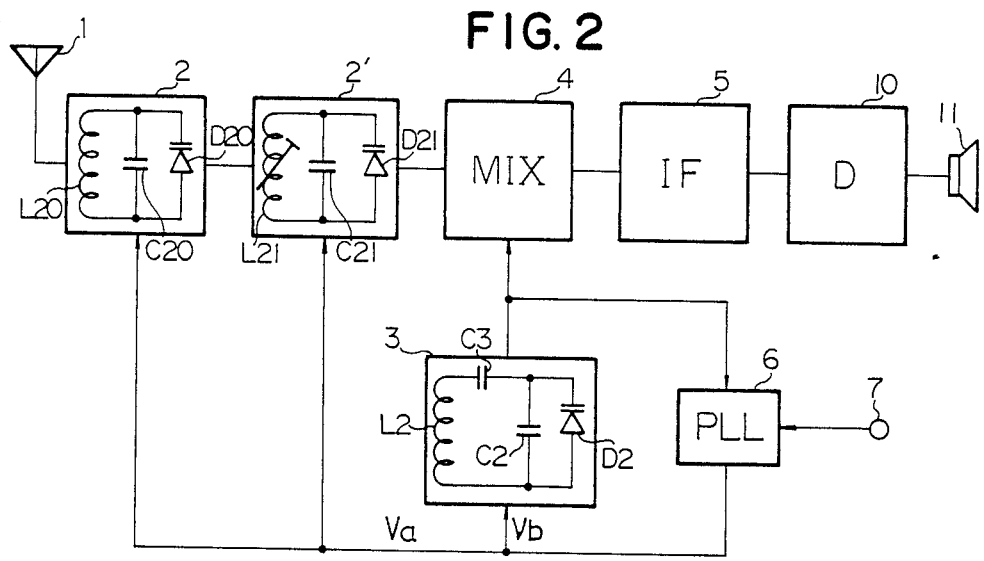
FIG. 2 is a block diagram showing an AM receiver provided with the electronic tuning circuit according to another embodiment of the present invention.

FIG. 2 illustrates another embodiment of the present invention, wherein the electronic tuning circuit provided at the front-end portion of the AM receiver includes a high-frequency amplifier circuit 2' provided at the back of the antenna tuning circuit 2 to thereby enhance the selectivity for the desired frequency. The circuit constants of the high-frequency amplifier circuit 2' may be set up to be equal to those in the embodiment illustrated in FIG. 1. Local oscillator circuit 3, mixer circuit 4 and the remainder of this embodiment are similar to those of the embodiment shwon in FIG. 1. The antenna tuning circuit 2 comprises a tuning coil L20, parallel capacitance C20 and variable capacitance diode D20; and the high-frequency amplifier circuit 2' comprises a tuning coil L21 provided with an inductance adjusting core, parallel capacitance C21 and variable capacitance diode D21. It is also possible that the tuning coil of the high-frequency tuning circuit 2' may be either a preadjusted high-frequency coil or nonadjustable highfrequency coil so that the tuning coil of the antenna tuning circuit 2 is adjusted at the final stage of the adjustment procedures for the AM receiver, in contrast to the embodiment of FIG. 2.

The parallel capacitances C1, C2, C20 and C21 are meant to include the stray capacitances of the respective tuning circuits as well as the capacitaces of the fixed capacitors which are connected with the tuning coils.

With reference to FIGS. 4 to 8, description will now be made of the distribution of tracking error with respect to the receiving frequency of the AM receiver shown in FIG. 1. These views illustrate tracking errors which tend to occur due to dispersions in the circuit constants constituting the tuning circuit 2 and local oscillator circuit 3.

Figure 4:
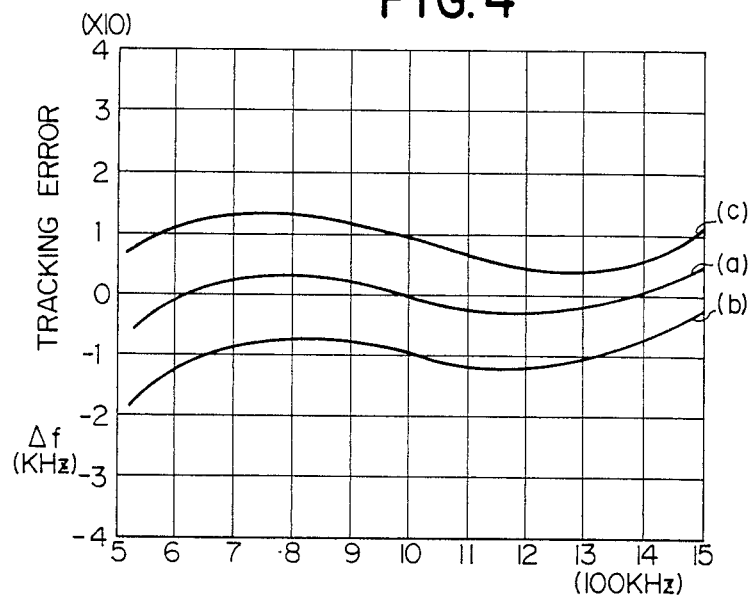
FIGS. 4 to 8 are views useful for explaining about tracking errors which tend to occur in AM receiver using the electronic tuning circuit embodying the present invention.
Figure 5:
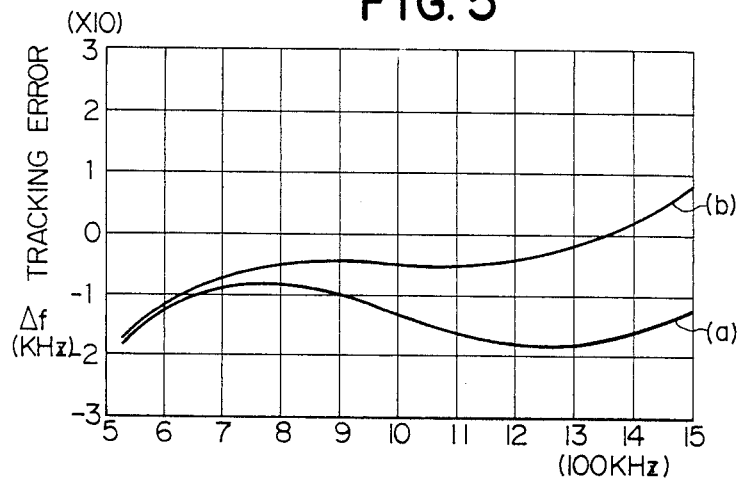
Figure 6:
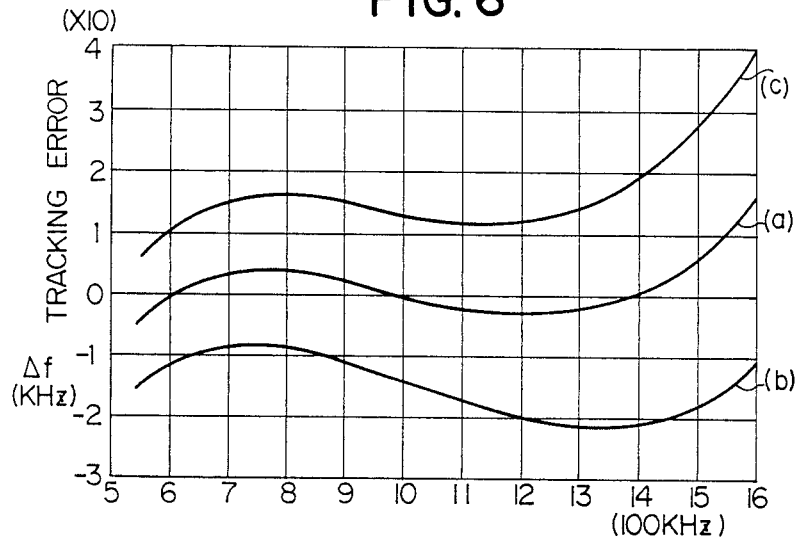
Figure 7:
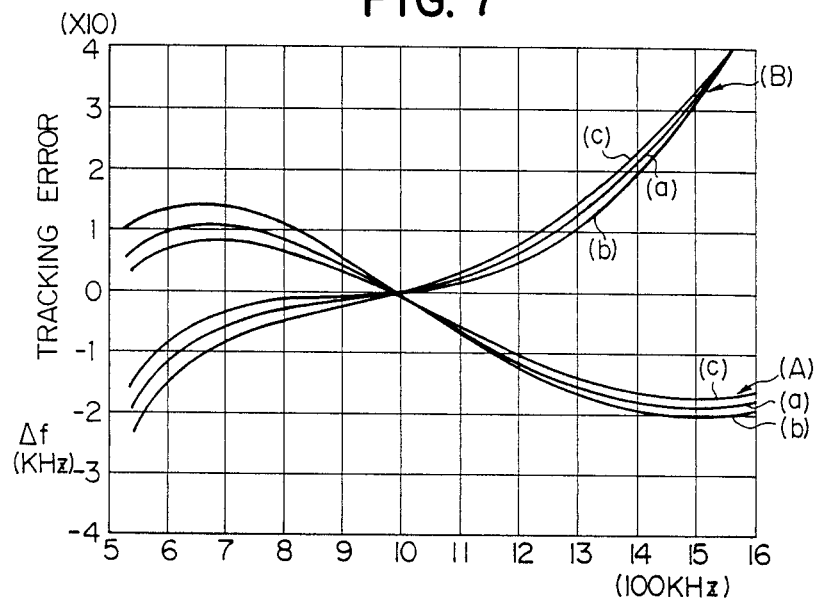
Figure 8:
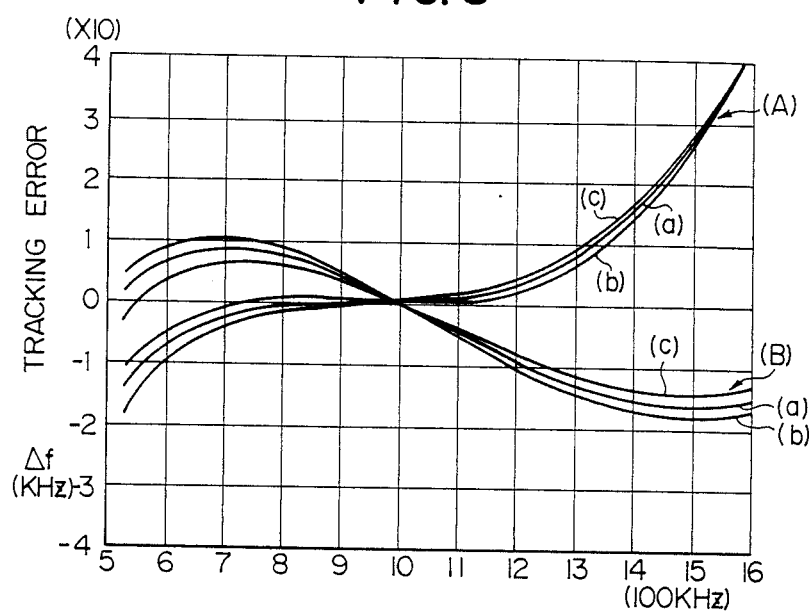
Figure 9:
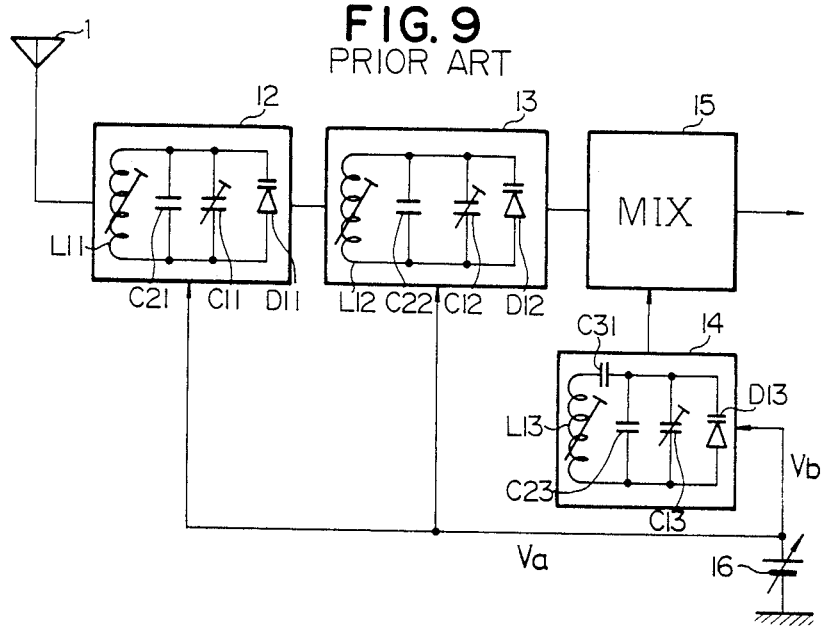
FIG. 9 is a block diagram showing a conventional electronic tuning circuit for AM receiver.

FIG. 4 illustrates tracking error curves for the cases where the capacitance value of the padding capacitor C3 incorporated in the local oscillator circuit 3 was changed while the remaining circuit constants remain unchanged. FIG. 5 illustrates tracking error curves for the cases where the value of the parallel capacitance C2 was changed while the capacitance value of the padding capacitor C3 incorporated in the local oscillator circuit 3 remains unchanged. FIG. 6 illustrates tracking error curves for the cases where the inductance of the tuning coil L2 provided in the local oscillator circuit 3 was changed. FIG. 7 shows tracking error curves for the cases where the dispersion tolerance for each of the elements of the tuning circuit is set up to be within the range of $\pm 5\%$, illustrating the manner in which maximum tracking errors for such tolerances occur. FIG. 8 shows tracking error curves for the cases where the worst distribution of tracking errors occurs when the dispersion tolerance for the padding capacitor C3 of the tuning circuit is set up to be within the range of $\pm 2\%$ while the dispersion tolerance for each of the remaining elements of the tuning circuit is set up to be within the range of $\pm 5\%$.

Further description will next be made of the relationship between tracking errors and the circuit constants of the electronic tuning circuit.

Table 1 shows the component constants of the electronic tuning circuit which represent the tracking error curves illustrated in FIG. 4, wherein the capacitance value of the padding capacitor C3 is changed while the tuning coil L1 and parallel capacitance C1 of the antenna tuning circuit and the tuning coil L2 and parallel capacitance C2 of the local antenna circuit 3 remain unchanged. In FIG. 4, the curve (a) shows the case where the capacitance value of the padding capacitor is 490 pF; the curve (b) shows the case where the capacitance value is equal to the value for the case (a) plus 5% of it; and curve (c) shows the case where the capacitance value is equal to the value for the case (a) minus 5% of it. The tracking error curves (a), (b) and (c) of FIG. 4 represent tracking error distributions adjusted with about 1 MHz as the reference. In Table 1, the circuit constants of the circuit shown in FIG. 1 are indicated, and the column a indicates the circuit constants of the electronic tuning circuit which represent the minimum tracking error. The circuit constants shown in Tables 1 to 7 are rounded to one decimal.

TABLE 1

|  | FIG. 4 | | |
| --- | --- | --- | --- |
|  | (a) | (b) | (c) |
| C3 (pF) | 490 | 465 | 515 |
| C1 (pF) | 20.6 | 20.6 | 20.6 |
| L1 ($\mu$H) | 185.5 | 185.5 | 185.5 |
| C2 (pF) | 32.7 | 32.7 | 32.7 |
| L2 ($\mu$H) | 105.6 | 105.6 | 105.6 |

By changing the capacitance value of the padding capacitor C3, the conditions that tracking errors occur are changed as shown in FIG. 4, from which it will be appreciated that the distribution of tracking errors is varied over the entire receiving frequency band. The variation that tends to occur in the lower frequency range is somewhat greater than that that tends to occur in the higher frequency band. However, it is to be understood that the tracking errors represented by the curves (a), (b) and (c) constitute no practical hindrance.

The tracking error curves shown in FIG. 5 are ones to determine the influence of the stray capacitance C2, wherein the tracking error curve (b) is one obtained by changing the stray capacitance C2 of the local oscillator circuit 3 by about 6% with respect to the curve (a). FIG. 5 shows that the variation in the higher frequency range is very great, from which it is inferred that the tracking error tends to be greatly deviated from the tolerable range when the tracking error curve is upwardly deviated and thus that it is necessary to keep the dispersion tolerance for at least the stray capacitance C2 within the range of ±5%. Table 2 shows the circuit constants of the electronic tuning circuit shown in FIG. 4.

TABLE 2

|  | FIG. 5 | |
|---|---|---|
|  | (a) | (b) |
| C3 (pF) | 465 | 465 |
| C1 (pF) | 20.6 | 20.6 |
| L1 (μH) | 185.5 | 185.5 |
| C2 (pF) | 31.7 | 33.7 |
| L2 (μH) | 105.6 | 105.6 |

FIG. 6 is a view useful for determining what effect a variation in the inductance of the tuning coil L2 of the local oscillator circuit 3 has on occurrence of tracking error, wherein the curve (b) is for the case where the inductance value of the tuning coil L2 is changed by ±2% with respect to the inductance value for the curve (a) while the curve (c) is for the case where the inductance value of the tuning coil L2 is changed by −2% with respect to the inductance value for the cruve (a). From this, it will be appreciated that the variation in the inductance value of the tuning coil L2 has a remarkable effect on occurrence of tracking error. Table 3 shows the circuit constants for these cases, wherein the ±2% variation in the inductance value of the tuning coil L2 is permissible.

TABLE 3

|  | FIG. 6 | | |
|---|---|---|---|
|  | (a) | (b) | (c) |
| C3 (pF) | 490 | 490 | 490 |
| C1 (pF) | 20.6 | 20.6 | 20.6 |
| L1 (μH) | 185.5 | 185.5 | 185.5 |
| C2 (pF) | 32.7 | 32.7 | 32.7 |
| L2 (μH) | 105.6 | 107.7 | 103.5 |

It is inferred that it is necessary to keep the dispersion tolerance for each of the elements of the local oscillator circuit 3 within the range of ±5%.

Reference will now be made to FIG. 7 which illustrates, at A and B, the manners in which the AM receiver suffers from maximum tracking errors, wherein the dispersion tolerance for each of the elements of the electronic tuning circuit shown in FIG. 1 is kept within the range of ±5% with respect to the values indicated in the column (a) in Table 1. More specifically, in FIG. 7, the curves indicated at A are the tracking error curves when the values of the tuning coil L1 and parallel capacitance C1 were changed by +5% while the curves indicated at B are the tracking error curves when the values of the tuning coil L1 and parallel capacitance C1 were changed by −5%. FIG. 7 illustrates two type of combinations in which maximum tracking errors occur at the upper and lower limits of the receiving band, and the circuit constants therefor are shown in Tables 4 and 5. From the tracking error curves of FIG. 7, it will be seen that the tracking errors can be reduced by adjusting the inductance of the tuning coil L1 incorporated in the antenna tuning circuit 2. Thus, even with a combination that a maximum tracking error tends to occur, it is possible to adjust the tracking error to such a range that the tracking error constitutes no practical hindrance, by effecting the tracking adjustment at one point, i.e., approximately at the center of the receiving frequency band of the AM receiver.

TABLE 4

|  | FIG. 7 A | | |
|---|---|---|---|
|  | (a) | (b) | (c) |
| C3 (pF) | 515 | 515 | 515 |
| C1 (pF) | 21.6 | 21.6 | 21.6 |
| L1 (μH) | 191.5 | 189.8 | 179.6 |
| C2 (pF) | 31.1 | 31.1 | 31.1 |
| L2 (μH) | 105.6 | 107.7 | 103.5 |

TABLE 5

|  | FIG. 7 B | | |
|---|---|---|---|
|  | (a) | (b) | (c) |
| C3 (pF) | 465 | 465 | 465 |
| C1 (pF) | 19.6 | 19.6 | 19.6 |
| L1 (μH) | 178.5 | 191.1 | 180.2 |
| C2 (pF) | 34.4 | 34.4 | 34.4 |
| L2 (μH) | 105.6 | 107.7 | 103.5 |

As will be appreciated from the above discussion, FIG. 7 illustrates the cases where maximum tracking errors tend to occur, and the possibility that tracking errors deviated from the range indicated therein occurs, is very low since electronic components of a high quality are usually available, so that an electronic tuning circuit with less tracking error for an AM receiver can be provided.

According to the embodiment of FIG. 2, the tuning coil 20 of the antenna tuning circuit 2 may be either a fixed type coil or a high-frequency coil which is adjusted at the final adjustment stage, so that optimum tracking adjustment can be effected simly by adjusting the inductance of the tuning coil 21 of the high-frequency amplifier circuit 2'.

Figure 3:
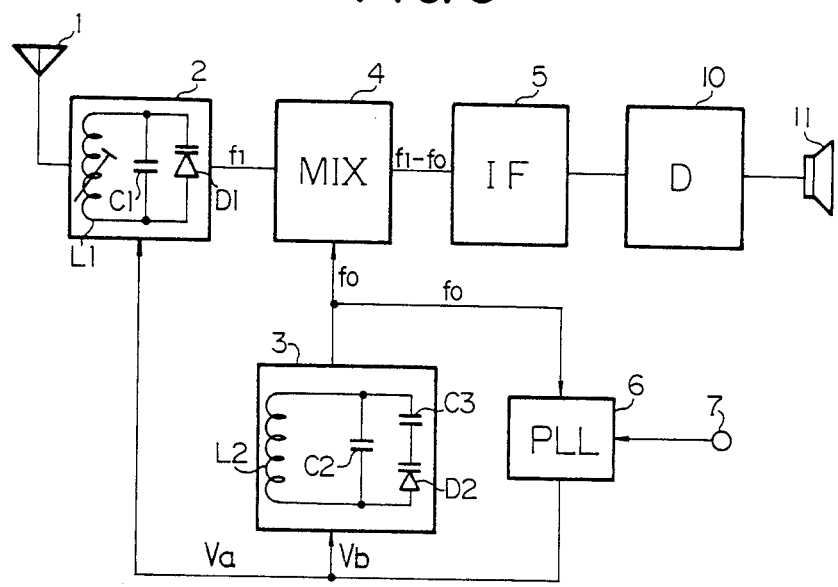
FIG. 3 is a block diagram showing an AM receiver provided with the electronic tuning circuit according to still another embodiment of the present invention.

Referring to FIG. 3, there is illustrated a third embodiment of the invention, wherein the local oscillator circuit 3 may be arranged in such a manner the padding capacitor C3 is connected in parallel relationship with the tuning coil L2 and parallel capacitance C2. With such an arrangement, too, it is possible to achieve tracking adjustment characteristics similar to those achieved with the aforementioned embodiments.

FIG. 8 illustrates the cases where the tolerance for the padding capacitor C3 is set up to be within the range of ±2%. Table 6 shows the constants of the electronic tuning circuit which represent the tracking error curves indicated at A in FIG. 8, wherein the capacitance of the padding capacitor C3 was changed by −2%; the inductance of the tuning coil L1 was changed by +4% at the maximum; the value of the parallel capacitance C1 was changed by −5%; and the value of the parallel capacitance C2 was changed by +5%. Table 7 shows the circuit constants of the electronic tuning circuit which represent the tracking error curves indicated at B in FIG. 8, wherein the capacitance of the padding capacitor was changed by +2%; the inductance of the tuning coil L1 was changed by −4% at maximum; the value of the stray capacitance C1 was changed by +5%; and the value of the parallel capacitance C2 was changed by −5%.

TABLE 6

| | FIG. 8 A | | |
|---|---|---|---|
| | (a) | (b) | (c) |
| C3 (pF) | 480 | 480 | 480 |
| C1 (pF) | 19.6 | 19.6 | 19.6 |
| L1 (μH) | 183.6 | 193.2 | 182.3 |
| C2 (pF) | 34.4 | 34.4 | 34.4 |
| L2 (μH) | 105.6 | 107.7 | 103.5 |

TABLE 7

| | FIG. 8 B | | |
|---|---|---|---|
| | (a) | (b) | (c) |
| C3 (pF) | 500 | 500 | 500 |
| C1 (pF) | 21.6 | 21.6 | 21.6 |
| L1 (μH) | 187.2 | 188.1 | 178.0 |
| C2 (pF) | 31.1 | 31.1 | 31.1 |
| L2 (μH) | 105.6 | 107.7 | 103.5 |

From the tracking error curves of FIG. 8, it will be seen that an electronic tuning circuit for AM receiver with less tracking errors than those shown in FIG. 7, can be provided. It is also possible to establish a better receiving condition by adjusting the inductance of the tuning coil L1 of the antenna tuning circuit 2, like the results shown in FIG. 7. It is to be noted, however, that FIG. 8 illustrates combinations in which maximum tracking errors occur, and that the probability that the aforementioned combinations occur, is usually very low.

As will be appreciated from the foregoing discussion, the necessity that the inductance values of the tuning coils L1 and L2 be adjusted after the electronic tuning circuit has been mounted in place, is eliminated by changing the capacitance of the padding capacitor C3 by ±2%, and by keeping variations in the stray capacitances C1 and C2, including parallel capacitances between the terminals of the circuit, within the range of ±5%. Thus, the circuit constants of the high-frequency coils can be very easily adjusted to the design values so that the circuit constants of the tuning coils L1 and L2 may be either previously adjusted or fixed to be incorporated in the electronic tuning circuit. In this way, by limiting dispersions in the circuit constants of the electronic tuning circuit within the above-indicated dispersion range of the circuit constants, it is possible to provide an electronic tuning circuit for AM receiver, which is of substantially non-adjustment type, i.e., capable of maintaining a satisfactory receiving condition without effecting tracking adjustment after the electronic tuning circuit has been mounted in position.

Although in the aforementioned embodiments of the present invention, the circuit constants were set in such a manner that tracking errors turn out to be minimum with a frequency of about 1 MHz as the center, it is to be understood that the present invention is by no means limited thereto; it is also possible that the circuit constants may be set up so that tracking errors become minimum at any desired frequency. With the circuit arrangement of FIG. 1 or 2, it is possible to provide an electronic tuning ciruit for AM receiver, which is easy to effect tracking adjustment even with long wave (LW), by keeping the dispersion tolerance for the circuit constants of the electronic tuning circuit within the above-indicated range.

As will be appreciated from the foregoing explanation, with electronic tuning circuit of the preset type for AM receiver according to the present invention, the necessity is eliminated to effect tracking adjustment at two points in the receiving frequency band by using a trimmer capacitor as in the prior art. More specifically, according to this invention, it is only required that either the antenna tuning circuit at the front-end portion of the receiver or the tuning coil of the high-frequency amplifier circuit be adjusted so that the receiving sensitivity becomes maximum substantially at the center of the receiving frequency band, thereby making it possible to reduce the number of parts of the electronic tuning circuit. In this way, according to the present invention, there is provided an electronic tuning circuit for AM receiver, which is of substantially non-adjustment type requiring no tracking adjustment to be effected at the final adjustment stage. Furthermore, according to the present invention, the electronic tuning circuit can be miniaturized, and the number of steps involved in the trakcing adjustment can be reduced, so that the manufacturing cost can be reduced accordingly.

While the present invention has been illustrated and described with respect to specific embodiments, it is to be understood that the present invention is by no means limited thereto but encompass all changes and modifications which will become possible within the scope of the appended claims.

We claim:

1. An electronic tuning circuit for an AM receiver wherein an oscillation frequency control voltage for setting an oscillation frequency of a local oscillator circuit to be higher or lower than a tuned frequency by an amount corresponding to an intermediate frequency is supplied thrugh a preset system, comprising: an antenna tuning circuit including a first tuning coil for effecting tracking adjustment, a fixed capacitor, and a first variable capacitance diode; and a local oscillator circuit including a second tuning coil, fixed capacitors, and a second variable capacitance diode which are connected so that in an oscillation output that is automatically adjusted to a desired frequency is provided by said local oscillator circuit, said electronic tuning circuit being designed such that dispersion in inductance values of said first and second tuning coils and dispersion in capacitances in said antenna tuning circuit and local oscillator circuit, are set within the range of ±5%, and wherein tracking errors are decreased by adjusting the inductance of said first tuning coil alone.

2. An electronic tuning circuit for an AM receiver wherein an oscillation frequency control voltage for setting an oscillation frequency of a local oscillator circuit to be higher or lower than a tuned frequency by an amount corresponding to an intermediate frequency, is supplied through a preset system, comprising an antenna tuning circuit including a first tuning coil for effecting tracking adjustment, a fixed capacitor, and a first variable capacitance diode; and a local oscillator circuit including a second tuning coil, fixed capacitors, and a second variable capacitance diode which are connected so that an oscillation output that is automatically adjusted to a desired frequency is provided by said local oscillator circuit, said electronic tuning circuit being designed such that dispersions in inductance of said first tuning coil, in inductance of the tuning coil of a high-frequency amplifier circuit, in inductance of said second tuning coil of the local oscillator circuit, and in capacitancies in said antenna tuning circuit and said local oscillator circuit, are set within a range of ±5%, and wherein tracking errors are decreased by adjusting the inductance of said first tuning coil alone.

3. An AM receiver wherein an oscillation frequency control voltage for setting an oscillation frequency of a local oscillator circuit to be higher or lower than a tuned frequency, is supplied through a preset system, comprising: an antenna tuning circuit including a first tuning coil for effecting tracking adjustment, a fixed capacitor, and a first variable capacitance diode; and a local oscillator circuit including a second tuning coil, fixed capacitors, a padding capacitor, and a second variable capacitance diode which are connected so that an oscillation output that is automatically adjusted to a desired frequency is provided by said local oscillator circuit, said receiver including an electronic tuning circuit consisting essentially of said antenna tuning circuit and said local oscillator circuit, said electronic tuning circuit being designed such that dispersion in capacitance of said padding capacitor is set within a range of ±2% so that tracking errors of said electronic tuning circuit are decreased.

4. An electronic tuning circuit for an AM receiver wherein an oscillation frequency control voltage for setting an oscillation frequency of a local oscillator circuit higher or lower than a tuned frequency by an amount corresponding to an intermediate frequency, is supplied through a preset system, comprising: an antenna tuning circuit including a first tuning coil for effecting tracking adjustment, a fixed capacitor, and a first variable capacitance diode; and a local oscillator circuit including a second tuning coil, fixed capacitors, a padding capacitor, and a second variable capacitance diode which are connected so that an oscillation output that is automatically adjusted to a desired frequency is provided by said local oscillator circuit, said electronic tuning circuit being designed such that dispersions in inductance of said first tuning coil, in inductance of said second tuning coil, and in capacitances of said antenna tuning circuit and said local oscillator circuit, are set within a range of ±5%, and dispersion in capacitance of said padding capacitor is set within a range of ±2%, so that tracking errors are decreased.

5. An electronic tuning circuit for an AM receiver wherein an oscillation frequency control voltage for setting an oscillation frequency of a local oscillator circuit to be higher or loer by an amount corresponding to an intermediate frequency, is supplied through a preset system, comprising: an antenna tuning circuit including a first tuning coil for effecting tracking adjustment, a fixed capacitor, and a first variable capacitance diode; and a local oscillator circuit including a second tuning coil, fixed capacitors, a padding capacitor, and a second variable capacitance diode which are connected so that an oscillation output that is automatically adjusted to a desired frequency is provided by said local oscillator circuit, said electronic tuning circuit being designed such that dispersion in inductance of said first tuning coil, in inductance of a tuning coil incorporated in a high-frequency amplifier circuit, and in capacitances of said antenna tuning circuit and said high-frequency amplifier circuit, are set within a range of ±5%, and wherein dispersion in capacitance of said padding capacitor is set within a range of ±2%, so that tracking errors are decreased.

* * * * *